United States Patent [19]

Kimock et al.

[11] Patent Number: 5,135,808
[45] Date of Patent: Aug. 4, 1992

[54] ABRASION WEAR RESISTANT COATED SUBSTRATE PRODUCT

[75] Inventors: Fred M. Kimock, Macungie; Bradley J. Knapp, Allentown; Steven J. Finke, Kutztown, all of Pa.

[73] Assignee: Diamonex, Incorporated, Allentown, Pa.

[21] Appl. No.: 589,447

[22] Filed: Sep. 27, 1990

[51] Int. Cl.$^5$ ............................................. B32B 17/06
[52] U.S. Cl. .................................... 428/336; 428/408; 428/426; 428/432; 428/489; 428/472; 428/697; 428/698; 428/701; 428/913
[58] Field of Search ............... 428/336, 408, 698, 697, 428/701, 426, 432, 469, 472, 913

[56] References Cited

U.S. PATENT DOCUMENTS

| | | | |
|---|---|---|---|
| 4,060,660 | 11/1977 | Carlson et al. | 428/426 |
| 4,383,728 | 5/1983 | Litington | 350/1.7 |
| 4,597,844 | 7/1986 | Hiraki et al. | 428/408 |
| 4,603,082 | 7/1986 | Zelez | 428/408 |
| 4,647,494 | 3/1987 | Meyerson et al. | 428/408 |
| 4,734,339 | 3/1988 | Schachner et al. | 428/698 |
| 4,847,157 | 7/1989 | Goodman et al. | 428/212 |
| 4,849,290 | 7/1989 | Fujimori et al. | 428/408 |

FOREIGN PATENT DOCUMENTS

| | | |
|---|---|---|
| 0161829 | 11/1985 | European Pat. Off. |
| 0239280 | 9/1987 | European Pat. Off. |
| 203903 | 11/1983 | German Democratic Rep. |
| 204693 | 12/1983 | German Democratic Rep. |
| 51-128686 | 11/1976 | Japan |
| 59-026906 | 2/1984 | Japan |
| 61-55603 | 3/1986 | Japan |
| 61-106494 | 5/1986 | Japan |
| 63-195266 | 8/1988 | Japan |
| 63-221840 | 9/1988 | Japan |
| 63-221841 | 9/1988 | Japan |
| 64-2001 | 1/1989 | Japan |

OTHER PUBLICATIONS

Joffreau et al. "Low-Pressure Diamond Growth on Refractory Metals" *R & HM* Dec. 1988, pp. 186–194.

Nir "Protection by Diamond-like Carbon Films of Fused Silica Slides from Erosion by the Impact of Solid Particles" *Thin Solid Films* 144, 1986, pp. 201–209 144, 1986.

Bubenzer et al. "rf-plasma deposited amorphous hydrogenated hard carbon thin films: Preparation, properties and applications" *J. Appl. Phy.* 54(8) Aug. 1983 pp. 4590–4594.

*Primary Examiner*—Patrick J. Ryan
*Assistant Examiner*—Archene Turner
*Attorney, Agent, or Firm*—McCubbrey, Bartels, Meyer & Ward

[57] ABSTRACT

The coated substrate product finds particular application in eyeglass and sunglass lenses, architectural glass, analytical instrument windows, automotive windshields and laser bar code scanners for use in retail stores and supermarkets. The product comprises a substantially optically transparent substrate, a chemically vapor deposited first interlayer bonded to the substrate and a chemically vapor deposited outer layer of substantially optically transparent diamond-like carbon bonded to the interlayer and away from the substrate.

61 Claims, 1 Drawing Sheet

ABRASION WEAR RESISTANT COATED SUBSTRATE PRODUCT

FIELD OF THE INVENTION

This invention relates generally to coated substrate products. More particularly, the invention relates to a substantially optically transparent coated substrate product comprised of a parent substrate, one or more interlayers and a diamond-like carbon layer, and to a method for producing same.

BACKGROUND OF THE INVENTION

The properties of glass make it an ideal substrate material for use in many applications. In particular, the combination of optical transparency, with reasonable strength at a nominal cost, allows the widespread use of glass products. Glass, however, does suffer from several limitations. Glass is not a particularly hard material, and consequently it abrades in many applications. Additionally, glass is chemically reactive with many alkaline substances and with hydrofluoric acid. New applications and superior performance in existing applications could be thus realized for glass products if glass were more abrasion resistant and less chemically reactive. Examples of glass products which could benefit from improved abrasion resistance include eyeglass and sunglass lenses, architectural glass, analytical instrument windows, automotive windshields and laser bar code scanners for use in retail stores and supermarkets.

Diamond-like carbon films (DLC) are well known in the art and have been recognized as potential coatings to enhance the abrasion resistance of various substrate materials, including glass. The DLC coatings possess excellent optical properties and exhibit excellent resistance to abrasion and chemical attack by various acids, including hydrofluoric acid. However, it has been found that the DLC coatings will impart improved abrasion resistance to a substrate only if the adherence of the coating to the parent substrate is excellent.

The most obvious and common approach to coating the glass substrate is to apply the DLC coating directly onto a clean glass surface. However, this approach often results in a DLC coating which displays poor adhesion and therefore, poor abrasion resistance. DLC coatings are typically under significant compressive stress. This stress greatly affects the ability of the coating to remain adherent to the glass substrate. Additionally, glass often contains many alkali oxides and other additives which can inhibit the bonding of the $SiO_2$ in the glass to the carbon atoms in the DLC coating. It is currently believed that the reaction between the $SiO_2$ in glass and the DLC is essential for the coating to exhibit excellent adhesion. Therefore, less obvious methods are required to produce a glass substrate with a highly adherent DLC coating which provides excellent abrasion resistance.

In addition to glass substrates, many other optically transparent substrate materials, such as sapphire, glassy-ceramics, salts (NaCl, KBr, KCl, etc.), metal fluorides and metal oxides could benefit from a DLC coating, but contain elements which inhibit the bonding of the DLC layer.

Many methods for depositing DLC have been demonstrated, including radio frequency plasma deposition, ion beam sputter deposition from a carbon target, ion beam sputtered carbon with ion beam assist, direct ion beam deposition, dual ion beam deposition, laser ablation deposition from a carbon target, and ion beam assisted evaporation of carbon. Many of these prior art techniques have been used to deposit DLC on glass substrates, however, the emphasis of the prior art has not been on the adhesion of the DLC to the glass substrate or on the abrasion resistance of the coated substrate product. Illustrative are the following references: U.S. Pat. Nos. 4746538, 4400410, 4383728, 4504519, 4603082, 4060660, 4877677, 4569738 and 4661409; Japanese Patent Nos. 63221841, 63221840, 63195266, 1147068, 1147067, 64--2001, 59-26906 and 51128686; European Patent Nos. DD-203903, SU1006402, European patent Application #EPO 243541 (WO 87/02713); Deutchman, et al., Proc. SPIE-Int. Soc. Opt. Eng. 1146. 124-34, 1989; Collins, et al., Proc. SPIE-Int. Soc. Opt. Eng. 1146, 37-47, 1989; Liou, et al., Proc. PIE-Int. Soc. Opt. Eng. 1146, 12-20, 1989; Bubenzer, et al., Proc. DARPA Workshop Diamond-Like Carbon Coat., Meeting date 1982, Issue AD-A136 766, 33-47, edited by B. Bendow in NBS Spec. Publ. 669, 249-54, 1984; NBS Spec. Publ. 638, 482-82, 1984; Bubenzer, et al., NBS Spec. Publ. 638, 477-81, 1984; Appl. Phys. Lett. 55 631-3, 1989; J. Vac. Sci. Technol A 7, 2307-10, 1989; and D. Nir, Thin Solid Films, 144, 201-9, 1986. These references do not however describe the use of transparent interlayers to improve the adhesion of the amorphous carbon coating to the substrate.

It is therefore an object of this invention to provide a coated substrate product with superior abrasion wear resistance and reduced chemical reactivity.

It is a further object of this invention to provide a diamond-like carbon coating to the surface of an optically transparent substrate which is highly adherent and exhibits superior abrasion wear resistance.

It is a further object of this invention to provide a coated substrate with improved ease of cleaning.

It is a further object of this invention to provide a low cost and efficient process for producing a coated substrate product with superior abrasion wear resistance.

SUMMARY OF THE INVENTION

The disclosed abrasion wear resistant coated substrate product substantially reduces or eliminates the disadvantages and shortcomings associated with the prior art techniques. The invention discloses a substantially optically transparent composite structure which comprises a parent substrate, one or more intermediate layers and a diamond-like carbon layer. The invention also discloses a method for fabricating the coated substrate product.

According to the method, the substrate surface is initially chemically de-greased. In the second step, the substrate surface is bombarded with energetic gas ions to assist in the removal of residual hydrocarbons, as well as alkali metals and other additives. After the substrate surface has been sputter-etched, one or more interlayers are chemically vapor deposited on the substrate, followed by the deposition of a diamond-like carbon layer. Once the requisite number of interlayers and diamond-like carbon layers have been deposited, the coated substrate is cooled and removed from the reactor.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which.

DETAILED DESCRIPTION OF THE INVENTION

Figure 1:
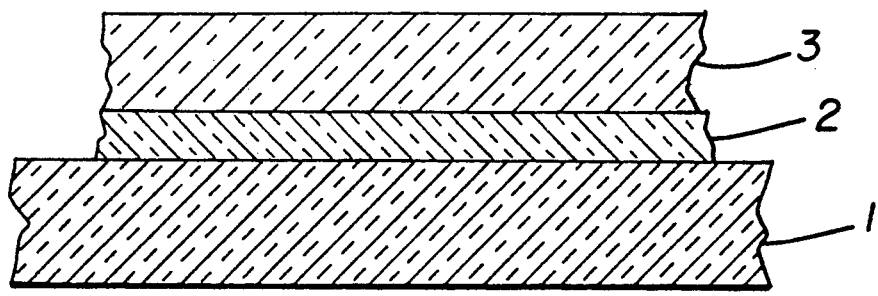
FIG. 1 is a cross-sectional view of the coated substrate product in accordance with the present invention.
Figure 2:
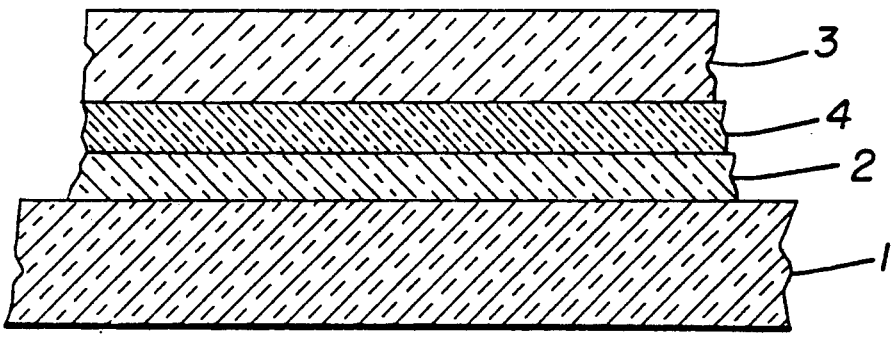
FIG. 2 is a cross-sectional view of the coated substrate product in accordance with a further embodiment of the prevent invention.
Figure 3:
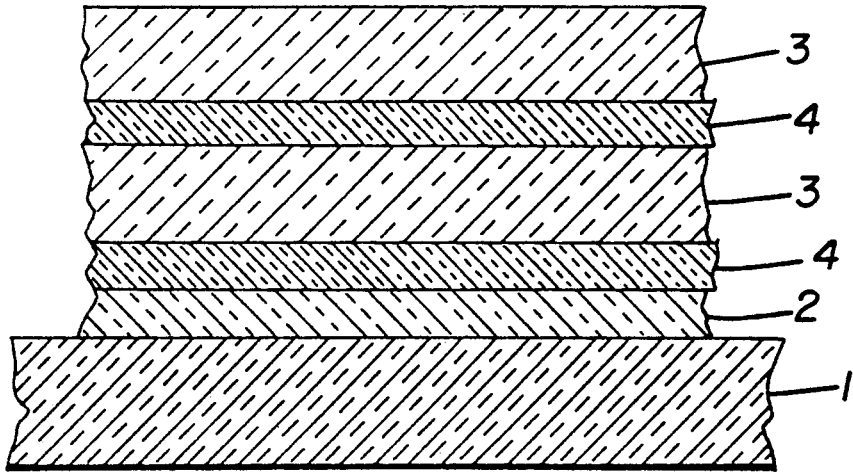
FIG. 3 is a cross-sectional view of the coated substrate product in accordance with a still further embodiment of the present invention.

In accordance with the present invention, the disclosed abrasion wear resistant coated substrate product substantially reduces or eliminates the disadvantages and shortcomings associated with the prior art techniques. As illustrated in FIGS. 1-3, the disclosed invention is a substantially optically transparent composite structure which comprises a parent substrate, one or more intermediate layers (interlayers) and a diamond-like carbon layer. By the term of "substantially optically transparent", it is intended to mean transparent to light in the visible region of the electromagnetic spectrum, which is generally between 350 nanometers and approximately 750 nanometers wavelength. A highly important technical advantage of the invention is that the resultant multilayer composite structure produces a highly abrasion wear resistant surface on various substrate materials, particularly glass.

In the preferred embodiment form of the invention, as illustrated in FIG. 1, a first interlayer 2 (or adhesion-mediating layer) is chemically vapor deposited onto a parent substrate 1 which comprises a substantially optically transparent amorphous material, a single crystal, polycrystalline materials, glass, salt materials, ceramic materials and/or mixtures thereof. By the term of "chemically vapor deposited", it is intended to mean materials deposited by vacuum deposition processes, including thermal evaporation, electron beam evaporation, magnetron sputtering, ion beam sputtering from solid precursor materials; thermally-activated deposition from reactive gaseous precursor materials; glow discharge, plasma, or ion beam deposition from gaseous precursor materials. Preferably, the first interlayer 2 is deposited onto the parent substrate 1 by ion beam or magnetron sputtering.

Atmospheric pressure deposition methods including arc-spray or plasma-spray deposition from gaseous or solid precursor materials, or thermally-activated deposition from reactive gaseous precursor materials may additionally be employed to deposit the first interlayer 2.

The first interlayer 2 generally comprises a substantially optically transparent material devoid of alkali metal atoms and fluorine, and capable of forming a strong chemical bond to the substrate 1 and the diamond-like carbon layer 3. By the term of "strong chemical bond", it is intended to mean that the interlayer is composed of a significant amount of an element or elements which are capable of undergoing a chemical reaction with carbon to form carbide-bonding. The absence of alkali metals and fluorine is essential to achieve a highly adherent interface between the first interlayer 2 and the diamond-like carbon layer 3. Thus, the first interlayer 2 must also have the property of providing a barrier to diffusion of alkali metals and additives from the parent substrate 1 to the diamond-like carbon layer 3.

In the preferred embodiment form of the invention, the first interlayer comprises silicon oxide, silicon dioxide, yttrium oxide, germanium oxide, hafnium oxide, tantalum oxide, titanium oxide, zirconium oxide and mixtures thereof. By the term "oxide", it is intended to mean a stoichiometrically oxidized material, or a partially oxidized material which contains excess metal atoms, or is deficient in oxygen. The first interlayer may further comprise silicon nitride, titanium nitride, tantalum nitride, hafnium nitride, zirconium nitride, boron nitride, silicon carbide, germanium carbide and mixtures thereof. By the term "nitride", it is intended to mean a material composed of a stoichiometric amount of nitrogen or a material which either contains excess nitrogen atoms, or is deficient in nitrogen. By the term "carbide", it is intended to mean a material composed of a stoichiometric amount of carbon or a material which either contains excess carbon atoms, or is deficient in carbon.

The first interlayer 2 can be from 5 Å to 10,000 Å in thickness. Preferably, the first interlayer 2 is at least 10 Å thick.

Following deposition of the first interlayer 2 onto the parent substrate 1, the diamond-like carbon layer 3 is chemically vapor deposited onto the coated substrate. The diamond-like carbon layer 3 can be from 10 Å to 10 micrometers in thickness. Preferably, the diamond-like carbon layer 3 is at least 200 Å thick.

To further enhance the abrasion wear resistance of the structure, more than one interlayer or a plurality of alternating interlayers and diamond-like carbon layers 3 may be deposited onto the parent substrate 1. It has been found that this arrangement allows for the deposition of a greater total thickness of DLC material, which provides a further increase in abrasion resistance. Thus, in further envisioned embodiments of the invention not shown the structure may comprise a parent substrate 1, two different and separately deposited first interlayers 2 and a diamond-like carbon layer 3; or a parent substrate 1 and two or more pairs of first interlayers 2 and diamond-like carbon layers 3.

In another embodiment of the invention, as illustrated in FIG. 2, a second interlayer 4 is chemically vapor deposited onto the coated substrate and positioned such that the second interlayer 4 is disposed between the first interlayer 2 and the diamond-like carbon layer 3. The second interlayer 4 would similarly comprise a substantially optically transparent material devoid of alkali metal atoms and fluorine, and capable of forming a strong chemical bond to the first interlayer 2 and the diamond-like carbon layer 3. The second interlayer may comprise a substantially optically transparent silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

Since the second interlayer 4 provides a diffusion barrier for alkali metal atoms, fluorine and/or any additional additives which would adversely effect the adherence of the diamond-like carbon layer 3, the first interlayer could further comprise a substantially optically transparent aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof.

The second interlayer 4 can be from 5 Å to 10,000 Å in thickness. Preferably, the second interlayer 4 is at least 10 Å thick.

The second interlayer 4 may alternatively comprise a substantially optically transparent metallic material capable of reflecting visible light and capable of forming a strong chemical bond with the first interlayer 2 and the diamond-like carbon layer 3, selected from the following two groups. In the first group, the metallic material may consist of silicon, germanium, hafnium, molybdenum, tungsten, yttrium, tantalum, titanium and zirconium. These metallic materials all form a strong chemical bond to the diamond-like carbon layer 3.

The second group of metallic materials comprises vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium. Preferable, the second interlayer 4 comprises rhenium, iridium, tin, indium, aluminum, nickel, iron, chromium, copper, gold, silver and platinum. Although these materials will provide a diffusion barrier to alkali metal atoms and fluorine, they will not form a strong carbide bond with the diamond-like carbon layer 3. Therefore, if any of these metallic materials are selected for the second interlayer 4, a third interlayer (not shown) must be disposed between the second interlayer 4 and the diamond-like carbon layer 3. The third interlayer would similarly comprise a substantially optically transparent material devoid of alkali metal atoms and fluorine and selected from the group consisting of silicon nitride, titanium nitride, tantalum nitride, hafnium nitride, zirconium nitride, boron nitride, yttrium oxide, geranium oxide, hafnium oxide, silicon oxide, silicon dioxide, tantalum oxide, titanium oxide, zirconium oxide, silicon carbide, geranium carbide and mixtures thereof. Although it is not necessary, this third interlayer may be employed with the aforementioned first group of metallic materials.

The metallic second interlayer 4 can be from 5 Å to 1000 Å in thickness. Preferably, the metallic second interlayer 4 is at least 25 Å thick.

In yet another embodiment of the invention, as illustrated in FIG. 3, the embodiment illustrated in FIG. 2 and discussed above is provided with a second composite layer comprising a first interlayer 2 and a diamond-like carbon layer 3. The resultant multilayer structure would thus be a parent substrate 1, a first interlayer 2, a second interlayer 4, a diamond-like carbon layer 3, a first interlayer 2 and a diamond-like carbon layer 3. The structure may alternatively comprise substrate 1, two first interlayers 2, a diamond-like carbon layer 3, a first interlayer 2 and a diamond-like carbon layer.

By choosing the appropriate interlayer 2,4 and diamond-like carbon layer 3 thicknesses, criteria which are known in the art of optical coating design could be employed in each of the aforementioned embodiments of the present invention to produce quarter wavelength stacks and other "dielectric stack" coating configurations. In these dielectric stack configurations, optical interference effects could be used to produce wavelength-selective mirrors or anti-reflection films. By choosing the appropriate thickness of at least one of the interlayers 2,4 and diamond-like carbon layer 3, the reflection of light at predetermined wavelength ranges may be either minimized or maximized. Superior abrasion wear resistance and environmental durability currently unavailable with conventional optical coatings could thus be realized by the incorporation of the dielectric stack configurations into the present invention.

The method of the present invention teaches those skilled in the art how to fabricate the transparent abrasion wear resistant coated substrate product. According to the method, the first step involves chemically degreasing the surface of the parent substrate 1. The substrate 1 is then placed into a chemical vapor deposition reactor vacuum chamber and the air evacuated from the chamber to less than approximately $5 \times 10^{-6}$ Torr.

In the next step the surface of the substrate 1 is sputter etched with energetic ions or atoms to assist in the removal of residual hydrocarbons, as well as alkali metals and other additives which are commonly present on the surface of the substrate materials, particularly glass. It has been found that the concentration of alkali metals (Na, Ca) at the surface of glass substrates was significantly reduced as a function of ion sputter-etching time and that increased sputter-etching time substantially improved the adhesion of the diamond-like carbon layer 3. [See Examples A-Q] Therefore, it is concluded that the removal of alkali metals and other additives is essential to a achieve a highly adherent interface between parent substrate 1 and the diamond like carbon layer 3.

The sputter-etching may be performed with a beam of inert gas ions, hydrogen ions or oxygen ions, a glow discharge or a plasma of inert gas, hydrogen or oxygen. In the preferred embodiment form of the invention, sputter-etching is performed with a beam of energetic gas ions at an energy of at least 200 eV.

Following the sputter-etching step one or more interlayers are chemically vapor deposited onto the parent substrate 1. During a first cycle any of the aforementioned conventional chemical vapor deposition methods may be employed to deposit the interlayers 2,4 (FIG. 2 and 3). The deposition rate of each interlayer 2,4 is generally in the range of about 0.1-10 microns/hour. The total thickness of each interlayer can be in the range of about 5 Å to 10,000 Å. In the preferred embodiment form of the invention, the total thickness for each interlayer is at least 10 Å.

After the chemical vapor deposition of one or more interlayers onto the parent substrate 1, a diamond-like carbon layer 3 is deposited onto the coated substrate. The diamond-like carbon layer 3 can be deposited by the following conventional methods; (i) direct ion beam deposition, dual ion beam deposition, glow discharge, RF-plasma, DC-plasma, or microwave plasma deposition from a carbon-containing gas or a carbon-containing vapor which can also be mixed with hydrogen, nitrogen-containing gases, oxygen containing gases and/or inert gas, (ii) electron beam evaporation, ion-assisted evaporation, magnetron sputtering, ion beam sputtering, or ion-assisted sputter deposition from a solid carbon target material, or (iii) combinations of (i) and (ii).

In the preferred embodiment form of the invention, the diamond-like carbon layer(s) is deposited by ion beam deposition from a hydrocarbon gas or carbon vapor. The ion beam deposition may also be performed in combination with an inert gas or hydrogen.

The deposition rate of the diamond-like carbon layer 3 is generally in the range of about 0.1–10 microns/hour. The total thickness of the diamond-like carbon layer is generally in the range of about 10 Å to 10 micrometers. Preferably, the thickness of the diamond-like carbon layer 3 is at least 200 Å thick.

After the deposition of the appropriate interlayers and diamond-like carbon layer(s) 3, as detailed in the aforementioned embodiments. The coated substrate product is cooled by extinguishing the deposition process and passing an inert gas over the substrate until it has reached substantially room temperature. The coated substrate product, exhibiting superior abrasion wear resistance, is then removed from the reactor.

The examples which follow illustrate the superior performance of the invention. The examples are for illustrative purposes only and are not meant to limit the scope of the claims in any way.

EXAMPLE A

A 2"×2"×0.375" thick float glass plate was cut from a glass bar code scanner window and coated by the following procedure. The glass plate was chemically cleaned by trichloroethane followed by methanol solvents in an ultrasonic bath. The sample was removed and blown dry with nitrogen gas. The glass plate was then mounted onto a substrate holder and part of the substrate surface was masked. The sample was then inserted into a vacuum chamber which was then evacuated to $8 \times 10^{-7}$ Torr. The sample was sputter-etched for 1 minute by a beam of $Ar^+$ ions at an energy of 500 eV and a current density of 0.5 mA/cm$^2$. The sample was then coated by direct ion beam deposition using an 11 cm ion beam source operated on $CH_4$ gas at a pressure of $7.2 \times 10^{-5}$ Torr. The ion energy was 75 eV and the ion beam current density was 0.30 mA/cm$^2$. A transparent coating of 3000 Å thickness was deposited. The sample was removed and scratch-tested by rubbing a sharp piece of glass or a glass jar across the interface between the coated and uncoated (masked) areas. While the uncoated area showed deep and wide scratches, no scratches were observed on the DLC-coated area. The coating was tested for adhesion by alternately immersing the sample in baths of boiling water (for 2 minutes) and ice water (for 2 minutes). After one thermal cycle, the coating peeled off of the glass substrate.

EXAMPLE B

A 2"×2"×0.375" thick float glass plate was chemically cleaned, mounted, masked, and ion sputter-etched in vacuum for 10 minutes by the procedure described in Example A. Next, a 100-Å thick layer of $SiO_2$ was deposited onto the glass plate by $Ar^+$ ion beam sputter deposition from a quartz target. Then, a diamond-like carbon layer of 3,000Å thickness was deposited by the method described in Example A. The coating could not be scratched when rubbed by a sharp piece of glass or a glass jar. The coating remained adherent after 5 thermal cycles between boiling water and ice water.

EXAMPLE C

A 2"×2"×0.375" thick float glass plate was chemically cleaned, mounted, masked, and ion sputter-etched in vacuum by the procedure described in Example B. Next, a 1,000-Å thick layer of $SiO_2$ was deposited onto the glass plate by $Ar^+$ ion beam sputter deposition from a quartz target. Then, a diamond-like carbon layer of 3,000 Å thickness was deposited by the method described in Example A. The coating could not be scratched when rubbed by a sharp piece of glass or a glass jar. The coating remained adherent after 5 thermal cycles between boiling water and ice water.

EXAMPLE D

A 2"×2"×0.375" thick float glass plate was chemically cleaned, mounted, masked, and ion sputter-etched in vacuum by the procedure described in Example B. Next, a the coating described in Example B was repeated three times in sequence, so the total coating thickness deposited onto the glass plate was 9,300 Å. The coating could not be scratched when rubbed by a sharp piece of glass or a glass jar. The coating remained adherent after 5 thermal cycles between boiling water and ice water.

EXAMPLE E

A 2"×2"×0.375" thick float glass plate was chemically cleaned, mounted, masked, and ion sputter-etched in vacuum by the procedure described in Example A, except the sputter-etching time was 5 minutes. Next, a 800 Å thick layer of $Al_2O_3$ was deposited onto the glass plate by $Ar^+$ ion beam sputter deposition from an aluminum oxide target. Then, a diamond-like carbon layer of 200 Å thickness was deposited by the method described in Example A. The coating could not be scratched when rubbed by a sharp piece of glass. After 24 hours, the coating peeled off the substrate.

EXAMPLE F

A 1" diameter×0.06" thick soda lime glass disk was chemically cleaned, mounted, masked, and ion sputter-etched in vacuum by the procedure described in Example A. Next, a 10,000 Å thick layer of $Al_2O_3$ was deposited onto the glass plate by $Ar^+$ ion beam sputter deposition from an aluminum oxide target. Then, a 300-Å thick layer of $SiO_2$ was deposited over the $Al_2O_3$ layer by $Ar^+$ ion beam sputter deposition from a quartz target. Next, a diamond-like carbon layer of 200 Å thickness was deposited by the method described in Example A. The coating could not be scratched when rubbed by a sharp piece of glass. After 5 thermal cycles between boiling water and ice water, the coating remained adherent.

EXAMPLE G

A 6"×6"×0.375" thick float glass plate was initially coated with about 2,000 Å of $SnO_2$ by thermally activated deposition from an organo-tin compound. The plate was then chemically cleaned by the procedure described in Example A, mounted, masked, and installed into a vacuum chamber which was then evacuated to $3.5 \times 10^{-6}$ Torr. The sample was sputter-etched for 2 minutes by a beam of $Ar^+$ ions at an energy of 500 eV and a current density of 0.5 mA/cm$^2$. Next, a 1,000-Å thick layer of $SiO_2$ was deposited over the $SnO_2$ layer by $Ar^+$ ion beam sputter deposition from a quartz target. Then, a diamond-like carbon layer of 2,000 Å thickness is deposited by the method described in Example A. After 5 thermal cycles between boiling water and ice water, the coating remained adherent.

EXAMPLE H

A 6"×6"×0.375" thick float glass plate coated with about 2,000 Å of $SnO_2$ was chemically cleaned by the procedure described in Example A, mounted, masked, and installed into a vacuum chamber which was then evacuated to $6\times10^{-7}$ Torr. The sample was sputter-etched for 2 minutes by a beam of $Ar^+$ ions at an energy of 500 eV and a current density of 0.5 mA/cm$^2$. Then, a diamond-like carbon layer of 2,000 Å thickness was deposited by the method described in Example A. During deposition, the DLC coating began to peel off of the substrate, indicating poor adhesion.

EXAMPLE I

A 27 mm diameter×2 mm thick sapphire window was ultrasonically cleaned in trichloroethane, followed by acetone, and then methanol, and blown dry with nitrogen gas. The sapphire sample was mounted into the vacuum coating system and, after evacuation, sputter-etched for 3 minutes as described in Example A. Then, a 1000-Å thick layer of diamond-like carbon was deposited onto the sapphire substrate using the conditions described in Example A. A powdery carbon material was observed on the surface of the substrate upon removal from the coating chamber indicating that the coating was not adherent.

EXAMPLE J

A 27 mm diameter×2 mm thick sapphire window was cleaned, mounted into a vacuum coating system, evacuated, and sputter-etched for 1 minute using the conditions described in Example A. Then, a 100-Å thick layer of SiO$_2$ was deposited onto the sapphire substrate using the conditions described in Example B. Next, a transport, 1000-Å thick layer of diamond-like carbon was deposited onto the sapphire substrate using the conditions described in Example A. The diamond-like carbon coating was very adherent, and could not be scratched with 50-micron quartz powder.

EXAMPLE K

A 27 mm diameter×2 mm thick sapphire window was cleaned, mounted into a vacuum coating system, evacuated, and sputter-etched for 1 minute using the conditions described in Example A. Then, a 50-Å thick layer of Si was deposited onto the sapphire substrate by $Ar^+$ ion beam sputter deposition from a Si target. Next, a transparent, 1000-Å thick layer of diamond-like carbon was deposited onto the sapphire substrate using the conditions described in Example A. Subsequent optical spectroscopy analysis of the coating revealed that the Si layer had been converted into a transparent layer of SiC by this process. The diamond-like carbon coating was very adherent, and could not be scratched with 50-micron quartz powder.

EXAMPLE L

A 130 mm diameter×1 mm thick aluminosilicate disk was mounted into a vacuum coating system, evacuated, and sputter-etched for 5 minutes, using the conditions described in Example A. Then, a 100-Å thick layer of SiO$_2$ was deposited onto the aluminosilicate substrate using the conditions described in Example B. Next, a 150-Å thick layer of diamond-like carbon was deposited onto the aluminosilicate substrate using the conditions described in Example A. The coating was very adherent, and could not be scratched with a sharp piece of glass.

EXAMPLE M

A 5.5"×5.5"×0.18" thick plate of Corning Code #9984-Pyroceram® (Note: Pyroceram® is a glass-/ceramic material composed at least of rutile, aluminum oxide, and magnesium silicate.) was cleaned in isopropyl alcohol, blown dry with nitrogen gas, mounted into a vacuum coating system, evacuated, and sputter-etched for 15 minutes using the conditions described in Example A. Then, a 200-Å thick layer of SiO$_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE N

A 5.5"×5.5"×0.18" thick plate of borosilicate glass was cleaned in isopropyl alcohol, blown dry with nitrogen gas, mounted into a vacuum coating system, evacuated, and sputter-etched for 15 minutes using the conditions described in Example A. Then, a 200-Å thick layer of SiO$_2$ was deposited onto the substrate as described in Example B. Next, a transparent, 2000-Å thick layer of diamond-like carbon was deposited onto the substrate using the conditions described in Example A. The coating was very adherent, and could not be scratched by a sharp piece of glass.

EXAMPLE O

A 2"×2"×¼" thick piece float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of SiO$_2$ was deposited onto the substrates using the conditions described in Example B. Next, a 100-Å thick layer of Si was deposited on top of the SiO$_2$ layer by $Ar^+$ ion beam sputter deposition from a Si target. Finally, a 1,000-Å thick layer of transparent diamond-like carbon was deposited on top of the Si layer using the conditions described in Example A. The coating was very adherent, and could not be scratched with a sharp piece of glass which could easily scratch the uncoated glass substrates. The coating on the sunglass lens exhibited an intense blue-purple reflected color.

EXAMPLE P

A 2"×2"×¼" thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 100-Å thick layer of SiO$_2$ was deposited onto the substrates using the conditions described in Example B. Next, a 100-Å thick layer of Cr metal was deposited by $Ar^+$ ion beam sputter deposition from a Cr target. Next, a second 100-Å thick layer of SiO$_2$ was deposited on top of the Cr layer. Finally, a 1,000-Å thick layer of transparent diamond-like carbon was deposited on top of the SiO$_2$ layer using the conditions described in Example A. The coating was very adherent, and could not be scratched with a sharp piece of glass which could easily scratch the un-coated glass substrates. The coating on the sunglass lens exhibited a bright blue reflected color.

EXAMPLE Q

An adherent, abrasion-resistant quarter-wavelength stack reflecting coating was formed on glass substrates. The layer thicknesses were chosen to maximize reflectance at a wavelength of 450 nanometers. The refractive index of the deposited $SiO_2$ layers was about 1.5, and the refractive index of the deposited DLC layers was about 2.05. The coating was formed as follows:

A 2"×2"×¼" thick piece of float glass and a 70 mm diameter×3 mm thick neutral gray glass sunglass lens were ultrasonically cleaned in isopropanol, and blown dry with nitrogen gas. The substrates were mounted into the vacuum coating system and, after evacuation, sputter-etched for 5 minutes as described in Example A. Then, a 750-Å thick layer of $SiO_2$ was deposited onto the substrates using the conditions described in Example B. Next, a 550-Å thick layer of transparent diamond-like carbon was deposited on top of the first $SiO_2$ layer using the conditions described in Example A. Next, a 750-Å thick layer of $SiO_2$ was deposited on top of the first DLC layer using the conditions described in Example B. Finally, a 550-Å thick layer of transparent diamond-like carbon was deposited on top of the second $SiO_2$ layer using the conditions described in Example A. The coating was very adherent, and could not be scratched with a sharp piece of glass which could easily scratch the uncoated glass substrates. The coating exhibited a light yellow-blue reflected color on the sunglass lens, and a light blue reflected color on the glass plate.

From the foregoing description, one of ordinary skill in the art can easily ascertain that the present invention provides a novel method for producing a substantially optically transparent multilayer composite structure. A highly important technical advantage of the invention is that superior abrasion wear resistance is achieved by use of a multilayer transparent structure comprised of a parent substrate, one or more interlayers and a diamond-like carbon outer layer.

Without departing from the spirit and scope of this invention, one of ordinary skill can make various changes and modifications to the invention to adapt it to various usages and conditions. As such, these changes and modifications are properly, equitably, and intended to be, within the full range of equivalents of the following claims.

We claim:

1. A coated substrate product comprised of a substantially optically transparent substrate which is transparent to light in the visible region of 350 to approximately 750 nanometers and which comprises a material selected from the group consisting of an amorphous material, a single crystal, polycrystalline materials, glass, salt materials, ceramic materials and mixtures thereof and at least one composite layer, said composite layer comprising a chemically vapor deposited first interlayer bonded to said substrate, and a chemically vapor deposited outer layer of substantially optically transparent diamond-like carbon which is transparent to light in the visible region of 350 to approximately 750 nanometers and is bonded to said first interlayer and away from said substrate, said first interlayer comprising a substantially optically transparent material devoid of alkali metal atoms and fluorine, which first interlayer is transparent to light in the visible region of 350 to approximately 750 nanometers and is selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof and capable of forming a strong chemical bond to said substrate and a strong chemical bond to said diamond-like carbon outer layer, whereby said product has improved abrasion resistance.

2. The product of claim 1 wherein said first interlayer is at least 10 Å thick.

3. The product of claim 1 wherein the thickness of said diamond-like carbon outer layer is at least 200 Å thick.

4. The product of claim 1 wherein the thickness of at least one of said first interlayer and said diamond-like carbon outer layer is selected to minimize the reflection of light at predetermined wavelengths.

5. The product of claim 1 wherein the thickness of at least one of said first interlayer and said diamond-like carbon outer layer is selected to maximize the reflection of light at predetermined wavelengths.

6. The product of claim 1 wherein the thickness of said diamond-like carbon layer corresponds to integer multiples of quarter wavelength optical thickness at predetermined wavelengths.

7. The product of claim 1 wherein the thickness of said first interlayer and said diamond-like carbon layer corresponds to integer multiples of quarter wavelength optical thickness at predetermined wavelengths.

8. The product of claim 1 wherein said composite layer comprises said first interlayer toward said substrate, a second interlayer which is transparent to light in the visible region of 350 to approximately 750 nanometers disposed immediately adjacent to said first interlayer and away from said substrate of a substantially optically transparent material and devoid of alkali metal atoms and fluorine and capable of forming a strong chemical bond to said first interlayer and a strong chemical bond to diamond-like carbon, and said diamond-like carbon outer layer disposed immediately adjacent to said second interlayer and away from said substrate.

9. The product of claim 8 wherein said second interlayer comprises a substantially optically transparent metallic material capable of reflecting visible light selected from the group consisting of silicon, germanium, hafnium, molybdenum, tungsten, yttrium, tantalum, titanium and zirconium.

10. The product of claim 9 wherein said second interlayer is at least 25 Å thick.

11. The product of claim 10 wherein said second interlayer comprises a substantially optically transparent metallic material capable of reflecting visible light selected from the group consisting of vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium.

12. The product of claim 11 wherein said second interlayer is at least 25 Å thick.

13. The product of claim 11 including a third interlayer disposed between said second interlayer and said diamond-like carbon outer layer of a substantially optically transparent material which third interlayer is transparent to light in the visible region of 350 to approximately 750 nanometers and is devoid of alkali metal atoms and fluorine and capable of forming a strong chemical bond with said second interlayer and said diamond-like carbon outer layer.

14. The product of claim 13 wherein said third interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

15. The product of claim 14 wherein the thickness of at least one of said first interlayer, said third interlayer and said diamond-like carbon outer layer is selected to minimize the reflection of light at predetermined wavelengths.

16. The product of claim 14 wherein the thickness of at least one of said first interlayer, said third interlayer and said diamond-like carbon outer layer is selected to maximize the reflection of light at predetermined wavelengths.

17. The product of claim 14 wherein the thickness of said third interlayer and said diamond-like carbon outer layer corresponds to integer multiples of quarter wavelength optical thickness at predetermined wavelengths.

18. The product of claim 14 wherein the thickness of said first interlayer, said third interlayer and said diamond-like carbon outer layer corresponds to integer multiples of quarter wavelength optical thickness at predetermined wavelengths.

19. The product of claim 10 wherein said second interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

20. The product of claim 19 wherein said second interlayer is at least 10 Å thick.

21. The product of claim 19 wherein the thickness of at least one of said first interlayer, said second interlayer and said diamond-like carbon outer layer is selected to minimize the reflection of light at predetermined wavelengths.

22. The product of claim 19 wherein the thickness of at least one of said first interlayer, said second interlayer and said diamond-like carbon outer layer is selected to maximize the reflection of light at predetermined wavelengths.

23. The product of claim 19 wherein the thickness of said second interlayer and said diamond-like carbon outer layer corresponds to integer multiples of quarter wavelength optical thickness at predetermined wavelengths.

24. The product of claim 19 wherein the thickness of said first interlayer, said second interlayer and said diamond-like carbon layer corresponds to integer multiples of quarter wavelength optical thickness at predetermined wavelengths.

25. The product of claim 19 wherein said composite layer comprises two different and separately deposited said second interlayers, and said diamond-like carbon outer layer disposed immediately adjacent to said plurality of said second interlayers.

26. The product of claim 8 wherein said composite layer includes a chemically vapor deposited fourth interlayer disposed between said second interlayer and said diamond-like carbon outer layer of a substantially optically transparent material devoid of alkali metal atoms and fluorine and capable of forming a strong chemical bond to said second interlayer and said diamond-like carbon outer layer.

27. The product of claim 26 wherein said second interlayer comprise a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof.

28. The product of claim 26 wherein said fourth interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

29. The product of claim 28 wherein said fourth interlayer is at least 10 Å thick.

30. The product of claim 26 wherein the thickness of at least one of said first interlayer, said second interlayer, said fourth interlayer and said diamond-like carbon outer layer is selected to minimize the reflection of light at predetermined wavelengths.

31. The product of claim 26 wherein the thickness of at least one of said first interlayer, said second interlayer, said fourth interlayer, and said diamond-like carbon outer layer is selected to maximize the reflection of light at predetermined wavelengths.

32. The product of claim 26 wherein the thickness of said second interlayer, said fourth interlayer and said diamond-like carbon layer corresponds to integer multiples of quarter wavelength optical thickness at predetermined wavelengths.

33. The product of claim 26 wherein the thickness of said first interlayer, said second interlayer, said fourth interlayer and said diamond-like carbon layer corresponds to integer multiples of quarter wavelength optical thickness at predetermined wavelengths.

34. A coated substrate product comprised of a substantially optically transparent substrate which is transparent to light in the visible region of 350 to approximately 750 nanometers and which comprises a material selected from the group consisting of an amorphous material, a single crystal, polycrystalline materials, glass, salt materials, ceramic materials and mixtures thereof, a first composite layer and at least one second composite layer, said first composite layer comprising a chemically vapor deposited first interlayer bonded to said substrate of a substantially optically transparent material capable of forming a strong chemical bond to said substrate which first interlayer is transparent to light in the visible region of 350 to approximately 750 nanometers and which is selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof, a second interlayer bonded to and disposed immediately adjacent to said first interlayer and away from said substrate of a substantially optically transparent material devoid of alkali metal atoms and fluorine and capable of forming a strong chemical bond to said first interlayer and a strong chemical bond to diamond-like carbon, and a first substantially optically transparent diamond-like carbon layer which is transparent to light in the visible region of 350 to approximately 750 nanometers and which is bonded to and disposed immediately adjacent to said second interlayer and away from said substrate, said second composite layer which is transparent to light in the visible region of 350 to approximately 750 nanometers and which is bonded to and disposed immediately adjacent to said first composite layer and away from said substrate comprising a chemically vapor deposited third interlayer disposed immediately adjacent to said first diamond-like carbon layer of a substantially optically transparent material devoid of alkali metal atoms and fluorine and capable of forming a strong chemical bond to diamond-like carbon and a second substantially optically transparent diamond-like carbon layer bonded to and disposed immediately adjacent to said third interlayer and away from said substrate, whereby said coated substrate product has improved abrasion resistance.

35. The product of claim 34 wherein said second interlayer and said third interlayer comprise a substantially optically transparent material selected from the group consisting of silicon nitride, titanium nitride, tantalum nitride, hafnium nitride, zirconium nitride, boron nitride, germanium oxide, hafnium oxide, silicon oxide, silicon dioxide, tantalum oxide, titanium oxide, yttrium oxide, zirconium oxide, silicon carbide, germanium carbide and mixtures thereof.

36. The product of claim 35 wherein said first composite layer comprises at least one pair of separately deposited said second interlayers.

37. The product of claim 34 wherein the thickness of said first interlayer, said second interlayer and said third interlayer is at least 10 Å thick.

38. The product of claim 34 wherein the thickness of said first diamond-like carbon layer and said second diamond-like carbon layer is at least 200 Å thick.

39. The product of claim 34 wherein the thickness of at least one of said first interlayer, said second interlayer, said third interlayer, said first diamond-like carbon layer and said second diamond-like carbon layer is selected to minimize the reflection of light at predetermined wavelengths.

40. The product of claim 34 wherein the thickness of at least one of said first interlayer, said second interlayer, said third interlayer, said first diamond-like carbon layer and said second diamond-like carbon layer is selected to maximize the reflection of light at predetermined wavelengths.

41. The product of claim 34 wherein the thickness of said second interlayer, said third interlayer, said first diamond-like carbon layer and said second diamond-like carbon layer corresponds to integer multiples of quarter wavelength optical thickness at predetermined wavelengths.

42. The product of claim 34 wherein the thickness of said first interlayer, said second interlayer, said third interlayer, said first diamond-like carbon layer and said second diamond-like carbon layer corresponds to integer multiples of quarter wavelength optical thickness at predetermined wavelengths.

43. The product of claim 34 wherein and said third interlayer comprise a substantially optically transparent material selected from the group consisting of silicon nitride, titanium nitride, tantalum nitride, hafnium nitride, zirconium nitride, boron nitride, germanium oxide, hafnium oxide, silicon oxide, silicon dioxide, tantalum oxide, titanium oxide, yttrium oxide, zirconium oxide, silicon carbide, germanium carbide and mixtures thereof.

44. The product of claim 43 wherein said second interlayer comprises a substantially optically transparent metallic material capable of reflecting visible light selected from the group consisting of silicon, germanium, hafnium, molybdenum, tungsten, yttrium, tantalum, titanium and zironium.

45. The product of claim 44 wherein said second interlayer, is at least 25 Å thick.

46. The product of claim 43 wherein said second interlayer comprises a substantially optically transparent metallic material capable of reflecting visible light selected from the group consisting of vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium.

47. The product of claim 46 wherein said second interlayer is at least 25 Å thick.

48. The product of claim 46 including a fourth interlayer disposed between said second interlayer and said first diamond-like carbon layer of a substantially optically transparent material devoid of alkali metal atoms and fluorine and capable of forming a strong chemical bond with said second interlayer and said first diamond-like carbon layer.

49. The product of claim 48 wherein said fourth interlayer comprises a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

50. The product of claim 48 wherein the thickness of at least one of said first interlayer, said fourth interlayer, said third interlayer, said first diamond-like carbon layer and said second diamond-like carbon layer is selected to minimize the reflection of light at predetermined wavelengths.

51. The product of claim 48 wherein the thickness of at least one of said first interlayer, said fourth interlayer, said third interlayer, said first diamond-like carbon layer and said second diamond-like carbon layer is selected to maximize the reflection of light at predetermined wavelengths.

52. The product of claim 48 wherein the thickness of said fourth interlayer, said third interlayer, said first diamond-like carbon layer and said second diamond-like carbon layer corresponds to integer multiples of quarter wavelength optical thickness at predetermined wavelengths.

53. The product of claim 48 wherein the thickness of said first interlayer, said fourth interlayer, said third interlayer, said first diamond-like carbon layer and said second diamond-like carbon layer corresponds to integer multiples of quarter wavelength optical thickness at predetermined wavelengths.

54. The product of claim 34 wherein said first composite layer includes a fifth interlayer disposed between said second interlayer and said first diamond-like carbon layer of a substantially optically transparent material devoid of alkali metal atoms and fluorine and capable of forming a strong chemical bond with said second interlayer and said diamond-like carbon outer layer.

55. The product of claim 54 wherein said third interlayer and said fifth interlayer comprise a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide and mixtures thereof.

56. The product of claim 55 wherein said fifth interlayer is at least 10 Å thick.

57. The product of claim 54 wherein and said second interlayer comprise a substantially optically transparent material selected from the group consisting of silicon nitride, titanium nitride, tantalum nitride, hafnium nitride, zirconium nitride, boron nitride, yttrium oxide, germanium oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof.

58. The product of claim 54 wherein the thickness of at least one of said first interlayer, said second interlayer, said fifth interlayer, said first diamond-like carbon layer, said third interlayer and said second diamond-like carbon layer is selected to minimize the reflection of light at predetermined wavelengths.

59. The product of claim 54 wherein the thickness of at least one of said first interlayer, said second interlayer, said fifth interlayer, said first diamond-like carbon layer, said third interlayer and said second diamond-like carbon layer is selected to maximize the reflection of light at predetermined wavelengths.

60. The product of claim 54 wherein the thickness of said second interlayer, said third interlayer, said fifth interlayer said first diamond-like carbon layer and said second diamond-like carbon layer corresponds to integer multiples of quarter wavelength optical thickness at predetermined wavelengths.

61. The product of claim 54 wherein the thickness of said first interlayer, said second interlayer, said third interlayer, said fifth interlayer said first diamond-like carbon layer and said second diamond-like carbon layer corresponds to integer multiples of quarter wavelength optical thickness at predetermined wavelengths.

* * * * *

UNITED STATES PATENT AND TRADEMARK OFFICE
CERTIFICATE OF CORRECTION

PATENT NO. : 5,135,808
DATED : August 4, 1992
INVENTOR(S) : Kimock, et al.

It is certified that error appears in the above-identified patent and that said Letters Patent is hereby corrected as shown below:

Column 5, line 57, after "comprise" insert --a parent--.

Column 13, line 33, after "claim" delete "10" and insert therefor --8--.

Column 3, line 8, delete "prevent" and insert therefor --present--.

Column 8, line 10, after "Next" delete "a".

Signed and Sealed this

Twenty-first Day of December, 1993

Attest:

BRUCE LEHMAN

*Attesting Officer*        *Commissioner of Patents and Trademarks*